(12) United States Patent
Grillmayer et al.

(10) Patent No.: US 10,281,616 B2
(45) Date of Patent: *May 7, 2019

(54) TRANSPARENT BODY FOR USE IN A TOUCH PANEL HAVING STRUCTURED TRANSPARENT CONDUCTIVE FILM DIRECTLY BETWEEN FIRST AND SECOND TRANSPARENT LAYER STACKS, METHOD OF MAKING, AND APPARATUS FOR MAKING

(75) Inventors: Jürgen Grillmayer, Chiayi (TW); Thomas Werner Zilbauer, Alzenau (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 499 days.

This patent is subject to a terminal disclaimer.

(21) Appl. No.: 14/384,820

(22) PCT Filed: Mar. 30, 2012

(86) PCT No.: PCT/EP2012/055869
§ 371 (c)(1),
(2), (4) Date: Oct. 23, 2014

(87) PCT Pub. No.: WO2013/143615
PCT Pub. Date: Oct. 3, 2013

(65) Prior Publication Data
US 2015/0062710 A1 Mar. 5, 2015

(51) Int. Cl.
*G02B 1/10* (2015.01)
*G02B 1/11* (2015.01)
(Continued)

(52) U.S. Cl.
CPC .............. *G02B 1/116* (2013.01); *C23C 14/35* (2013.01); *C23C 14/352* (2013.01); *G02B 1/105* (2013.01);
(Continued)

(58) Field of Classification Search
None
See application file for complete search history.

(56) References Cited

U.S. PATENT DOCUMENTS 6,689,458 B1 * 2/2004 Mikoshiba .............. B32B 27/06
428/156
2006/0214925 A1 9/2006 Taninaka et al.
(Continued)

FOREIGN PATENT DOCUMENTS

CN 1729410 A 2/2006
CN 101581800 A 11/2009
(Continued)

OTHER PUBLICATIONS

International Search Report and Written Opinion dated Oct. 25, 2012 for PCT/EP2012/055869.
(Continued)

*Primary Examiner* — Stephone B Allen
*Assistant Examiner* — Ryan S Dunning
(74) *Attorney, Agent, or Firm* — Patterson & Sheridan, LLP

(57) ABSTRACT

A process for manufacturing a transparent body for use in a touch screen panel is provided. The process includes: depositing a first transparent layer stack over a transparent substrate, wherein said first transparent layer stack includes at least a first dielectric film with a first refractive index, and a second dielectric film with a second refractive index different from the first refractive index, providing a structured transparent conductive film in a manner such that the first transparent layer stack and the transparent conductive film are disposed over the substrate in this order, and wherein the structured transparent conductive film has a sheet resistance of 100 Ohm/square or below, and depositing a second transparent layer stack over the transparent conductive film, wherein said second transparent layer stack
(Continued)

includes at least a third dielectric film with a third refractive index, and a fourth dielectric film or a transparent adhesive with a fourth refractive index, wherein the first transparent layer stack, the structured transparent conductive film and the second transparent layer stack are provided in this order.

19 Claims, 6 Drawing Sheets

(51) Int. Cl.
| | | |
|---|---|---|
| *C23C 14/35* | (2006.01) | |
| *H01J 37/34* | (2006.01) | |
| *G02B 1/116* | (2015.01) | |
| *G02B 1/14* | (2015.01) | |
| *G06F 3/041* | (2006.01) | |
| *G02B 5/28* | (2006.01) | |
| *G02B 1/115* | (2015.01) | |

(52) U.S. Cl.
CPC ............... *G02B 1/14* (2015.01); *G06F 3/041* (2013.01); *H01J 37/3405* (2013.01); *H01J 37/3414* (2013.01); *H01J 37/3429* (2013.01); *G02B 1/115* (2013.01); *G02B 5/285* (2013.01); *G06F 2203/04103* (2013.01); *H01J 2237/332* (2013.01)

(56) References Cited

U.S. PATENT DOCUMENTS

| | | | |
|---|---|---|---|
| 2008/0138589 A1 | 6/2008 | Wakabayashi et al. | |
| 2008/0152879 A1* | 6/2008 | Nashiki | C23C 14/08 428/212 |
| 2010/0013784 A1* | 1/2010 | Nashiki | C23C 14/08 345/173 |
| 2010/0013798 A1* | 1/2010 | Nakajima | G06F 3/044 345/176 |
| 2011/0318553 A1* | 12/2011 | Lotz | C23C 14/34 428/212 |
| 2012/0057237 A1 | 3/2012 | Wako et al. | |
| 2012/0114919 A1* | 5/2012 | Nakajima | G06F 3/044 428/203 |
| 2014/0216924 A1* | 8/2014 | Lotz | G02B 1/105 204/192.23 |
| 2015/0109234 A1* | 4/2015 | Lotz | H05K 3/00 345/174 |

FOREIGN PATENT DOCUMENTS

| | | |
|---|---|---|
| EP | 1574882 A1 | 9/2005 |
| EP | 2402481 A1 | 1/2012 |
| JP | 2006-023904 A | 1/2006 |
| JP | 2010-027294 A | 2/2010 |
| JP | 2010-086684 A | 4/2010 |
| JP | 2011-129165 A | 6/2011 |
| WO | 2006/126604 A1 | 11/2006 |
| WO | 2012/000793 A1 | 1/2012 |

OTHER PUBLICATIONS

Japanese Office Action (with attached English translation) for Application No. 2015-502112; dated Oct. 25, 2016; 6 total pages.
Chinese Office Action (with attached English translation) for Application No. 201280071777.6, dated Jun. 3, 2016; 16 total pages.
Japanese Office Action (with attached English translation) for Application No. 2015-5021122; dated Mar. 28, 2017; 7 total pages.
Japanese Office Action (with attached English translation) for Application No. 2015-502112; dated Aug. 24, 2017; 2 pages.
Korean Office Action (English translation) for Application No. 10-2014-7030596; dated Feb. 12, 2018; 5 total pages.

* cited by examiner

TRANSPARENT BODY FOR USE IN A TOUCH PANEL HAVING STRUCTURED TRANSPARENT CONDUCTIVE FILM DIRECTLY BETWEEN FIRST AND SECOND TRANSPARENT LAYER STACKS, METHOD OF MAKING, AND APPARATUS FOR MAKING

TECHNICAL FIELD

Embodiments of the present disclosure relate to processes and systems for manufacturing a transparent body for use in a touch panel and a transparent body fabricated according to these processes.

BACKGROUND ART

Touch panels are a particular class of electronic visual displays, which are able to detect and locate a touch within a display area. Generally, touch panels include a transparent body disposed over a screen and configured to sense a touch. Such a body is substantially transparent, so that light in the visible spectrum emitted by the screen can be transmitted therethrough. At least some known touch panels include a transparent body constituted by a barrier and a transparent conductor formed, in this order, over a substrate. A touch on the display area of such a panel generally results in a measurable change of capacitance in a region of the transparent body. The change in capacitance may be measured using different technologies, so that the position of the touch can be determined.

A transparent body for use with a touch panel is subject to some particular requirements. In particular, one key requirement is that the transparent body is stable enough for withstanding multiple contacts on the screen and harsh conditions, so that reliability of the touch screen is not compromised over time. However, at least some known transparent bodies included in touch screens, which are considered robust interfere with a proper transmission of light therethrough due to, for example, thickness, composition, and structure of the layers forming the transparent body. Furthermore, fabricating such a stable transparent body with high quality, for example with a uniform and defect-free barrier, is challenging.

Further, it is to be considered that there are different types of transparent bodies for touch panels. Particular consideration of the optical characteristics, e.g. the appearance to a user, has to be taken into account for transparent bodies, wherein the conductive layer for measuring the change in capacitance is a structured conductive layer.

A further aspect to be considered is the steadily increasing size of displays, wherein beyond the optical characteristics described above, also electrically characteristics are of increasing interest. Thereby, a design of thin film based flat panel displays and touch screen technologies, which provides an invisible object, which is patterned with respect to conductivity (like a touch sensor structure) and which exhibits enhanced optical and electrical performance compared to conventional structures, is desired.

Accordingly, it is desirable a process and an apparatus for forming a high-quality transparent body for use in a touch panel in a manner such that the body is stably formed over the substrate without compromising a proper transmission of light in the visible spectrum and improved electrical characteristics.

SUMMARY OF THE INVENTION

In light of the above, a process according to independent claims 1, a device according to independent claim 9, and an apparatus according to independent claim 19 are provided. Further aspects, advantages, and features of the present invention are apparent from the dependent claims, the description, and the accompanying drawings.

According to one embodiment, a process for manufacturing a transparent body for use in a touch panel is provided. The process includes optionally depositing a first transparent layer stack over a transparent substrate, wherein said first transparent layer stack includes at least a first dielectric film with a first refractive index, and a second dielectric film with a second refractive index different from the first refractive index. The process includes; depositing a structured transparent conductive film over the first transparent layer stack, wherein the structured transparent conductive film corresponding to a sheet resistance of 100 Ohm/square or below; depositing a second transparent layer stack over the transparent conductive film, wherein said second transparent layer stack includes at least a third dielectric film with a third refractive index, and a fourth dielectric film with a fourth refractive index different from the third refractive index, wherein the first transparent layer stack if provided, the structured transparent conductive film and the second transparent layer stack are provided in this order. According to an alternative embodiment, a transparent adhesive having a fourth refractive index different from the third refractive index can be provided instead of the fourth dielectric film.

According to another embodiment, a transparent body adapted for use in a touch panel is provided. The transparent body includes a transparent substrate, and optionally a first transparent layer stack deposited over the transparent substrate, wherein said transparent layer stack includes at least a first dielectric film with a first refractive index, and a second dielectric film with a second refractive index different from the first refractive index. The layers tack includes a transparent conductive film deposited over the first transparent layer stack, wherein the structured transparent conductive film has a sheet resistance of 100 Ohm/square or below, and a second transparent layer stack deposited over the transparent conductive film, wherein said second transparent layer stack includes at least a third dielectric film with a third refractive index, and a fourth dielectric film with a fourth refractive index different from the third refractive index. According to an alternative embodiment, a transparent adhesive having a fourth refractive index different from the third refractive index can be provided instead of the fourth dielectric film.

According to another embodiment, a deposition apparatus for manufacturing a transparent body for use in a touch panel is provided. The apparatus includes a first deposition assembly configured to deposit a first transparent layer stack over a substrate, said first transparent layer stack including at least first dielectric film with a first refractive index, and a second dielectric film with a second refractive index different from the first refractive index, a second deposition assembly configured to deposit a transparent conductive film, and a third deposition assembly configured to deposit a second transparent layer stack over the transparent conductive film, said second transparent layer stack including at least third dielectric film with a third refractive index, and a fourth dielectric film with a fourth refractive index different from the third refractive index, wherein said first deposition assembly, said second deposition assembly, and the third deposition assembly are arranged such that the first transparent layer stack, the transparent conductive film and the second transparent layer stack are disposed over the substrate in this order, and wherein at least one of the first deposition assembly or the second deposition assembly or the third deposition assembly includes a sputtering system operatively coupled to a target, said sputtering system being configured to deposit at least one of the first dielectric film, the second dielectric film, the third dielectric film, the fourth dielectric film or the transparent conductive film by sputtering of the target.

Surprisingly, the combination of dielectric films deposited according to embodiments of the present disclosure having additional dielectric films in comparison to at least some known transparent bodies for use in a touch panel, with a characteristic combination of refractive indexes in combination with second transparent layer stack of dielectric films, and in which at least one of the films is deposited by sputtering of a target, facilitates manufacturing of a high-quality transparent body that not only yields proper transmission of light but also yields stable performance over time. Yet further, as compared to existing "invisible" layer stacks or transparent bodies for touch panels, the resistance can be reduced, which is, for example, useful for large area touch panels.

Embodiments are also directed to apparatuses for carrying out the disclosed processes and including apparatus parts for performing described process steps. Furthermore, embodiments are also directed to methods by which the described apparatus operates or by which the described apparatus is manufactured. The methods may include method steps for carrying out functions of the apparatus or manufacturing parts of the apparatus. The method steps may be performed by way of hardware components, firmware, software, a computer programmed by appropriate software, by any combination thereof or in any other manner.

BRIEF DESCRIPTION OF THE DRAWINGS

A full and enabling disclosure, including the best mode thereof, to one of ordinary skill in the art, is set forth more particularly in the remainder of the specification, including reference to the accompanying figures, wherein.

DETAILED DESCRIPTION OF THE INVENTION

Reference will now be made in detail to the various embodiments, one or more examples of which are illustrated in the figures. Each example is provided by way of explanation, and is not meant as a limitation of the invention. It is contemplated that elements of one embodiment may be advantageously utilized in other embodiments without further recitation.

Figure 1A:
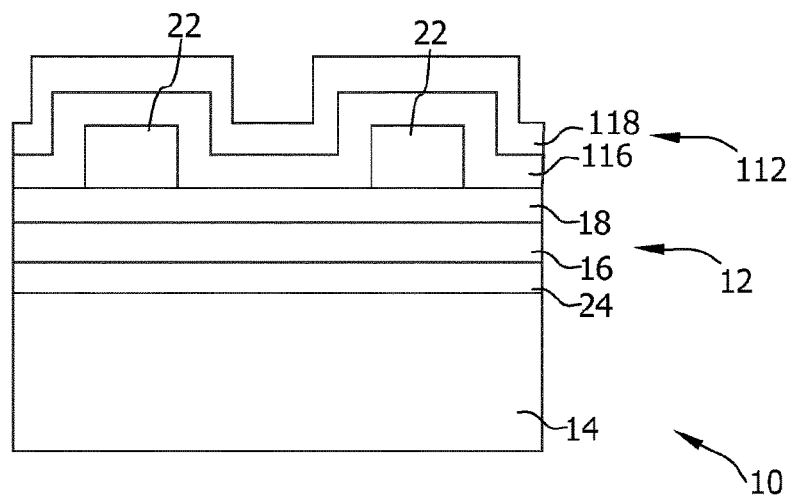
FIG. 1A is a schematic representation of an exemplary transparent body for use in a touch panel in accordance with embodiments herein.

According to embodiments herein, a first transparent layer stack 12, as depicted in FIG. 1A, is deposited over a substrate 14. The term "substrate" as used herein shall embrace both inflexible substrates, e.g., a wafer, slices of transparent crystal such as sapphire or the like, or a glass plate, and flexible substrates such as a web or a foil. The term "transparent" as used herein shall particularly include the capability of a structure to transmit light with relatively low scattering, so that, for example, light transmitted therethrough can be seen in a substantially clearly manner. In the case of a flexible substrate, it is typical that substrate 14 has a hard coat 15 formed thereon.

According to typical embodiments, a layer stack is constituted by a number of films formed (e.g., by deposition) one atop of another. In particular, embodiments herein include depositing a first transparent layer stack which may be constituted by a plurality of dielectric films, that is, films that, substantially, do not conduct electricity. In particular, first transparent layer stack 12 may include a first dielectric film 16, and a second dielectric film 18, as exemplarily depicted in FIG. 1A. Thereby, the first transparent layer stack may constitute a barrier for use in a touch panel.

As shown in FIG. 1A, a structured transparent conductive oxide (TCO) film 22 is provided over the transparent layer stack. According to typical embodiments, the structured TCO layer can be provided by depositing a TCO layer and patterning the TCO layer in order to provide a structured TCO layer. Alternatively, a mask and/or a photoresist can be provided to deposit the structured TCO layer.

According to typical embodiments, which can be combined with other embodiments described herein, the transparent conductive oxide layer can be an indium tin oxide (ITO) layer, a doped ITO layer, impurity-doped ZnO, $In_2O_3$, $SnO_2$ and CdO, ITO (In2O3:Sn), AZO (ZnO:Al), IZO (ZnO:In), GZO (ZnO:Ga), multi-component oxides including or consisting of combinations of ZnO, $In_2O_3$ and $SnO_2$, a layer stack from at least an ITO layer and a metal layer, e.g. an ITO/metal/ITO-stack or a metal/ITO/metal-stack.

Conventional layer stacks or transparent bodies for touch panels can result in a functional screen (like a touch screen). However, an inferior sunlight readability, a colored appearance (reflectance) of the screen and a color change with respect to the produced picture from the underlying display, and a more or less visible pattern from the structured core layer of the functional screen (e.g. a patterned transparent conductive oxide, TCO) is often obtained. Further, the conductivity might not be sufficient for large area touch panels, e.g. touch panels with a size of diagonal 7 inch or above, specifically for touch screens with a diagonal of more than 20 inch.

Due to the structure of the transparent layer stack, it is facilitated that the conductive film does not prejudice an optimal transmission of light through the body. In particular, a transparent layer stack according to embodiments herein facilitates that a conductive film, even a structured conductive film, does not affect the neutrality of the reflectance color, as further discussed below.

According to typical embodiments, which can be combined with other embodiments described herein, the sheet resistance of the structured TCO layer is 100 Ohm/sq and below, e.g. 10 to 50 Ohm/sq. Typically, the sheet resistance is the physical quantity referred to in this context, even though this value refers to the resistance of a layer with a sufficiently large area, i.e. without too small patterns. The structured TCO pattern, e.g. lines corresponds to a line resistance in Ohm. However, the sheet resistance is the relevant parameter and can be determined by deposition of test areas or can be determined or calculated based upon the resistance of patterned structures and the structure geometry. Accordingly, even though the sheet resistance of the structure layer can not be directly determined (yet indirectly) and rather refers to the resistance of a unstructured layer, a person skilled in the art would relate to a sheet resistance corresponding to a value for the structured layer.

According to different embodiments, the TCO films, e.g. ITO, can be deposited at relatively high temperatures or alternatively at lower temperatures, wherein in the latter case an annealing step after deposition can be provided in order to achieve desired layer characteristics such as the sheet resistance.

Thereby, for example, TCO layer thicknesses of 20 nm above, e.g. 50 nm to 150 nm can be utilized. Additionally or alternatively, transparent conductive oxides with a with a specific resistance lower than the typical resistivity range of ITO produced with various process schemes, which is 130-450 µΩcm for bulk ITO i.e. superior electrical characteristics, but with inferior optical characteristics could be used. The reduced sheet resistance and/or the increased TCO layer thickness results in the desire for further improvement of the layer stack, as the, e.g. thicker, structured TCO layer tends to be more easily visible.

According to embodiments described herein, an enhanced structure and method of manufacturing such an invisible object, e.g. a touch sensor, are provided to surpass limitations to the patterned TCO thickness and its conductivity. Layer stacks or transparent bodies, as described herein, which are provided on a display, or the like are considered invisible when placed in an atmosphere of air (refractive index 1) with very little difference in the optical appearance between areas with and without the TCO layer, such as ITO ("invisible" ITO). According to some embodiments, which can be combined with other embodiments described herein, different stacks and mounting scheme for an invisible object, e.g. for being integrated into or mounted onto a display in such a way, that at least on one side of the object the adjacent medium has a refractive index being different than 1, e.g. 1.3 to 1.7. By this means, the invisible stack can support a sheet resistance of 20 Ohm/sq or below, which is an improvement by a factor of 10 compared to the previous concepts without compromising on optical performance.

As shown in FIG. 1A a second transparent layer stack 112 is provided over the TCO layer 22. According to typical embodiments, a second layer stack is constituted by a number of films formed (e.g., by deposition) one atop of another. In particular, embodiments herein include depositing a second transparent layer stack, which may be constituted by a plurality of dielectric films, that is, films that, substantially, do not conduct electricity. In particular, second transparent layer stack 112 may include a third dielectric film 116, and a fourth dielectric film 118, as exemplarily depicted in FIG. 1A. Thereby, an improved index matching can be provided. Further, a passivation of the below TCO layer can be provided. Further, an overall transmittance can be provided as compared to an uncoated substrate.

According to typical embodiments described herein, which can be combined with other embodiments described herein, the first dielectric film 16 of the first transparent layer stack 12, i.e. the first transparent dielectric film over the substrate is a high refractive index film, e.g. with a refractive index of 1.8 or above. According to yet further alternative or additional modifications, the transparent conductive oxide layer is provided between, e.g. directly between, a low refractive index (1.5 or below) dielectric film and a high refractive index (1.8 or above) dielectric film. Further, additionally or alternatively, the last dielectric film over the substrate can be a low refractive index dielectric film. Thereby, the last dielectric film is referred to as the last dielectric film of the touch panel transparent body, i.e. before a transparent adhesive or air gap is provided at a bonding interface to a color filter, a second substrate or an optoelectronic device.

As compared to previous designs of touch panel displays where, particularly for layer stacks or transparent bodies with thicker TCO layers, an air gap has been provided, embodiments described herein provide a layer stack or transparent body having at least a first index matching layer stack, e.g. one or more dielectric films, a TCO layer over the index matching layer stack, wherein the TCO layer has a sheet resistance of 100 Ohm/sq or below, and a second index matching layer stack. A transparent adhesive can be provided onto transparent body, i.e. in contact with the transparent body according to embodiments described herein. Even though, an air gap might be used for mounting the herein described embodiments of a transparent body to an opto-electronic device, also an optical clear adhesive can be used. The embodiments thereby provide an "invisible" touch panel structure, which also provides for a low resistance. The second transparent layer stack for sandwiching the TCO between two transparent layer stacks and for obtaining a solution to low-resistance "invisible" TCO patterns refer to a structure having a TCO layer on top before this structure is bonded, e.g. optically bonded, onto the adjacent components of a touch screen display with a transparent adhesive. By utilizing the second transparent layer stack, a final pattern "invisibility" of the TCO pattern can be achieved.

According to embodiments herein, a first transparent layer stack 12, as depicted in FIG. IB, is deposited over a substrate 14. In the case of a flexible substrate, it is typical that substrate 14 has a hard coat 15 formed thereon.

According to typical embodiments, the layer stack 12 and the structured transparent conductive film 22 can be provided similar to the embodiments described with respect to FIG. 1A.

Figure 1B:
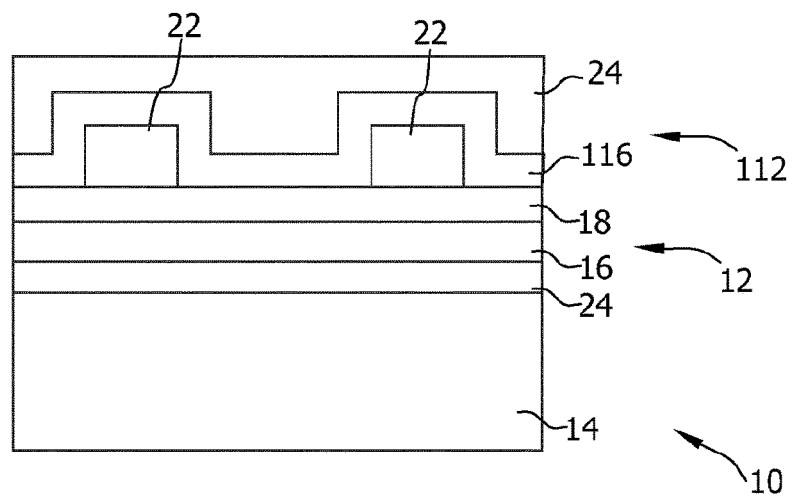
FIG. 1B is a schematic representation of an exemplary transparent body for use in a touch panel in accordance with embodiments herein.

As shown in FIG. 1B a second transparent layer stack 112 is provided over the TCO layer 22. According to typical embodiments, a second layer stack is constituted by a number of films or layers formed (e.g., by deposition) one atop of another. In particular, second transparent layer stack 112 may include a third dielectric film 116, and a transparent adhesive 24, with a refractive index different from the third dielectric film such that an index matching is provided.

According to typical embodiments described herein, which can be combined with other embodiments described herein, the first dielectric film 16 of the first transparent layer stack 12, i.e. the first transparent dielectric film over the substrate is a high refractive index film, e.g. with a refractive index of 1.8 or above. According to yet further alternative or additional modifications, the transparent conductive oxide layer is provided between, e.g. directly between, a low refractive index (1.5 or below) dielectric film and a high refractive index (1.8 or above) dielectric film.

As compared to previous designs of touch panel displays where, particularly for layer stacks with thicker TCO layers, an air gap has been provided, embodiments described herein provide a layer stack having at least a first index matching layer stack, e.g. one or more dielectric films, a TCO layer over the index matching layer stack, wherein the TCO layer has a sheet resistance of 100 Ohm/sq or below, and a second index matching layer stack. A transparent adhesive can be provided onto transparent body, i.e. in contact with the transparent body according to embodiments described herein. As illustrated with respect to FIGS. 1A and 1B, the transparent adhesive can be part of the second index matching layer stack or can be provided mainly for bonding purposes, e.g. by having a fourth dielectric film.

Even though, an air gap might be used for mounting the herein described embodiments of a transparent body to an opto-electronic device, also an optical clear adhesive can be used. The embodiments thereby provide an "invisible" touch panel structure, which also provides for a low resistance. The second transparent layer stack for sandwiching the TCO between two transparent layer stacks and for obtaining a solution to low-resistance "invisible" TCO patterns refer to a structure having a TCO layer on top before this structure is bonded, e.g. optically bonded, onto the adjacent components of a touch screen display with a transparent adhesive. By utilizing the second transparent layer stack, a final pattern "invisibility" of the TCO pattern can be achieved.

Figure 2:
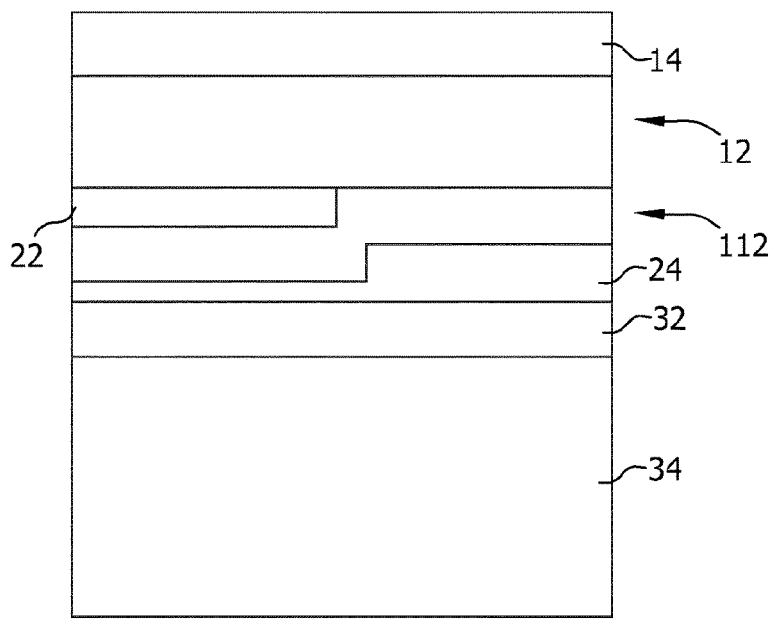
FIG. 2 is a schematic representation of a further exemplary transparent body for use in a touch panel and an opto-electronic device to which the body is bonded in accordance with embodiments herein.

As shown in FIG. 2, a transparent adhesive 24 is provided to bond the touch panel layer stack or transparent body having, e.g., a substrate 14, a layer stack 12, a structure TCO layer 22, and a second layer stack 112 to a display. In FIG. 2, the display is exemplarily indicated by a color filter 32 and a pixel array or display 34. Thereby, the transparent body 10 is shown inverted as compared to FIG. 1A. Accordingly, the substrate 14 can be, for example, a cover lens of a touch panel display. The term cover lens is typically used as a topmost glass of a touch panel. According to yet further embodiments, which can be combined with other embodiments described herein, the transparent body 10 can be bonded with the transparent adhesive, for example an OCA (optical clear adhesive), to a color filter glass, to a polarizer of a display structure, or to a liquid crystal display structure itself.

Embodiments according to the present invention relate to a layer stack or transparent body comprising of a substrate, e.g. a cover glass, and a stack of multiple layers that is mounted on top of a display with a clear adhesive, i.e. without an air gap. The first and second layer stacks include transparent, insulating materials with high and low refractive indexes (such SiOx, TiOx, NbOx, SiNx, SiOxNy, AlOxNy, MgF2, TaOx) and transparent conductive materials, like transparent conductive oxides, for example ITO. According to implementations, the method of layer coating or layer deposition can be chemical or physical vapor deposition.

According to an example, a layer stack or transparent body can be manufactured as follows, wherein improved visual invisibility and color fastness within the final TSP (touch screen panel)/display product and reduced electrical resistance can be provided. The layers are numbered as they are subsequently deposited on a substrate, e.g. a cover lens such as a glass having a thickness of 0.1 mm or above, e.g. of 0.5 mm: Layer 1: $Nb_2O_5$ of 5-200 nm thickness, e.g. of 8 nm. Layer 2: Si02 of 20-150 nm thickness, e.g. of 35 nm thickness, Layer 3: ITO of 20-200 nm thickness, e.g. of 150 nm thickness, wherein a patterning after deposition is conducted. Typically, the ITO layer can be deposited, e.g. by sputtering from a rotatable target, at a substrate temperature of 300° C. Layer 4: $Nb_2O_5$ of 5-200 nm thickness, e.g. of 100 nm Layer 5: Si02 of 20-150, e.g. of 87 or 90 nm. For example, the ITO thickness used for a touch sensor provides for very low sheet resistance of 15 Ohm/sqr or below. The reflection of the coated substrate is below 5% and the reflection difference between the area with and without ITO is below 0.2%. The visual transmission TY is above 92%. The optical color difference between areas with and without ITO, dE*ab is below 0.9. The layer stack or transparent body including the substrate has a neutral color for areas with and without ITO in reflection and transmission, e.g., la*I and lb*I are both below 1.0.

According to typical embodiments, which can be combined with other embodiments described herein, the first dielectric film being deposited on the substrate can typical be a high refractive index layer, e.g. with a refractive index of at least 1.8 For example, a niobium-oxide containing film can be deposited as the first dielectric film on the substrate.

According to yet further embodiments, which can be combined with other embodiments described herein, a TCO thickness of below 145 nm, e.g. of 20 nm to 130 nm, such as 75 nm, will result in even better invisibility characteristics as the above described values.

According to a further different example, a layer stack or transparent body can be manufactured as follows, wherein improved visual invisibility and color fastness within the final TSP (touch screen panel)/display product and reduced electrical resistance can be provided. The layers are numbered as they are subsequently deposited on a substrate, e.g. a cover lens such as a glass having a thickness of 0.1 mm or above, e.g. of 0.5 mm: Layer 1: $Nb_2O_5$ of 5-200 nm thickness, e.g. of 8 nm. Layer 2: Si02 of 20-150 nm thickness, e.g. of 31 nm thickness, Layer 3: ITO of 30-70 nm thickness, e.g. of 40 nm thickness, wherein a patterning after deposition is conducted. Typically, the ITO layer can be deposited, e.g. by sputtering from a rotatable target, at a substrate temperature of 300° C. Layer 4: $Nb_2O_5$ of 5-200 nm thickness, e.g. of 98 nm Layer 5: Si02 of 20-150 nm, e.g. of 87 or 90 nm. For example, the ITO thickness used for a touch sensor provides for very low sheet resistance of 50 Ohm/sqr or below. The reflection of the coated substrate is below 5% and the reflection difference between the area with and without ITO is below 0.4%. The visual transmission TY is above 94%. The optical color difference between areas with and without ITO, dE*ab is below 1.3. The layer stack or transparent body including the substrate has a neutral color for areas with and without ITO in reflection and transmission, e.g., la*I and lb*I are both below 1.0.

According to a yet further different example, a layer stack or transparent body can be manufactured as follows, wherein improved visual invisibility and color fastness within the final TSP (touch screen panel)/display product and reduced electrical resistance can be provided. The layers are numbered as they are subsequently deposited on a substrate, e.g. a cover lens such as a glass having a thickness of 0.1 mm or above, e.g. of 0.5 mm: Layer 1: $Nb_2O_5$ of 5-200 nm thickness, e.g. of 9 nm. Layer 2: Si02 of 20-150 nm thickness, e.g. of 28 nm thickness, Layer 3: ITO of 40-80 nm thickness, e.g. of 60 nm thickness, wherein a patterning after deposition is conducted. Typically, the ITO layer can be deposited, e.g. by sputtering from a rotatable target, at a substrate temperature of 300° C. Layer 4: $Nb_2O_5$ of 5-200 nm thickness, e.g. of 98 nm Layer 5: Si02 of 20-150 nm, e.g. of 89 nm. For example, the ITO thickness used for a touch sensor provides for very low sheet resistance of 30 Ohm/sqr or below. Similar values as described above can be provided with the yet further example.

According to a yet further different example, a layer stack or transparent body can be manufactured as follows, wherein improved visual invisibility and color fastness within the final TSP (touch screen panel)/display product and reduced electrical resistance can be provided. The layers are numbered as they are subsequently deposited on a substrate, e.g. a cover lens such as a glass having a thickness of 0.1 mm or above, e.g. of 0.5 mm: Layer 1: $Nb_2O_5$ of 5-200 nm thickness, e.g. of 7 nm. Layer 2: SiO2 of 20-150 nm thickness, e.g. of 23 nm thickness, Layer 3: ITO of 20-80 nm thickness, e.g. of 45 nm thickness, wherein a patterning after deposition is conducted. Typically, the ITO layer can be deposited, e.g. by sputtering from a rotatable target, at a substrate temperature of 300° C. Layer 4: SiO2 of 20-150 nm, e.g. of 23 nm Layer 5: $Nb_2O_5$ of 5-50 nm thickness, e.g. of 7 nm Similar values as described above can be provided with the yet further example.

Accordingly, in light of the above, according to some embodiments, which can be combined with other embodiments described herein, the fourth refractive index, e.g. of layer 5 above, can be higher than the third refractive index, e.g. of layer 4 above.

According to yet further typical embodiments, the dielectric films 16, 18, 116, and 118 can be layers including oxides, nitrides or oxinitrides, wherein the respective oxide, nitride or oxinitride includes at least 70 weight-%, typically at least 90 weight-% of the respective oxide-compound, nitride-compound, or oxinitride-compound. Thereby, either a layer structure for high transparency or a layer structure with improved transmission characteristics, as described below, can be provided.

More specifically, according to embodiments herein, the second, optionally a fourth dielectric film or further dielectric films can be a film, e.g. consisting of $S_jO_2$ have a lower refractive index than the first dielectric film, e.g. consisting of $Nb_2O_5$, [[$Si_3N_4$ or the like. A first transparent layer stack of a transparent body, e.g. a two-layer-type stack, and a second transparent layers stack, e.g. a two-layer-type stack, manufactured according to embodiments herein provides, in view of the additional dielectric films in comparison to at least some known transparent bodies for use in a touch panel and the characteristic combination of films with different refractive indexes, a barrier that facilitates a proper transmission of light through the transparent body. According to typical embodiments, which can be combined with other embodiments described herein, dielectric films with lower refractive index, for example lower than 1.50 or, more specifically, lower than 1.47 or, even more specifically, lower than 1.45 and dielectric films with higher refractive index, for example of at least 1.80 or, more specifically, at least 2.10, or, even more specifically, at least 2.40 are provided in an alternating manner. Thereby, films having lower refractive indexes can be provided by films containing SiOx, MgF, SiOxNy, or the like. For example, films having a higher refractive index can be provided by films containing NbOx, SiNx, SiOxNy, TiOx AlOx, AlOxNy, TaOx, or the like.

According to embodiments described herein, transparent body 10 includes a transparent conductive film 22, such as, but not limited to, indium tin oxide (ITO), in particular, crystalline ITO or ITO with a sheet resistance of 100 Ohm/square and below. According to different embodiments, which can be combined with other embodiments described herein, typically, ITO with composition 97% In2O3 and 3% SnO2 for crystalline ITO and/or ITO with composition 90% In2O3 and 10% SnO2 for non-crystalline ITO can be used.

Figure 3A:
FIGS. 3A to 3D are schematic representation of the manufacturing of an exemplary transparent body for use in a touch panel in accordance with embodiments herein.

FIGS. 3A to 3D illustrate manufacturing of a transparent layer stack or transparent body, which can for example be used for a touch panel display. As shown in FIG. 3A, the layer stack 12 is provided over the transparent substrate 14.

According to different embodiments, the transparent substrate can be a flexible substrate or a rigid substrate, an organic substrate or an inorganic substrate, can be a glass or a foil, and can have other characteristics like being linearly or circular polarizing, a lambda quarter retarder or non-polarizing. Typically, the transparent substrate can have a high degree of transparency in the visible range of 380 nm to 780 nm.

According to yet further examples, the transparent substrate 14 can include glass (flexible or rigid), plastic (flexible or rigid), which can further be already covered with thin film layers or hard coat, a linear or circular polarizer material, or lambda quarter retarder. Particularly for glass substrates, deposition processes and manufacturing methods on the glass substrate can be provided at higher temperatures as compared to plastic substrates. For example temperatures of 150° C. or above or even temperatures of 200° C. or above, such as 300° C., can be utilized for manufacturing of transparent bodies for the touch panel display on glass substrates.

According to yet further embodiments, which can be combined with other embodiments described herein, the layer stack 12 is typically an index matching layer stack having at least a first and a second dielectric film, wherein the first refractive index is provided by the first electric film and the second refractive index is provided by the second dielectric film, and wherein the second refractive index is lower from the first refractive index. According to an exemplary implementation, which can be combined with other embodiments described herein, a first dielectric film, a second dielectric film and a plurality of further dielectric films can be deposited such that a continuous or quasi-continuous (e.g. step-like with small steps) change in refractive index can be generated in the transparent layer stack 12. According to typical implementations, the dielectric films can be manufactured by chemical vapor deposition or physical vapor deposition, for example sputtering or evaporation. Typical examples can be insulating materials with high and low refractive indexes, for example SiOx, MgF, TiOx, NbOx, SiNx, SiOxNy, AlOx, AlOxNy, TaOx, and combinations thereof.

As shown in FIG. 3A a transparent conductive oxide layer 322 is deposited over the layer stack 12. According to embodiments described herein, the transparent conductive layer stack has increased conductivity by providing an increased layer thickness or a decreased specific resistance of the layer material. Thereby, for example, TCO layer thicknesses of 40 nm and above, e.g. 50 nm to 150 nm can be utilized.

According to yet further embodiments, which can be combined with other embodiments described herein, the transparent conductive oxide layer can also be provided as a transparent conductive oxide layer stack having one or more transparent conductive oxide films. During manufacturing, the transparent conductive oxide film or transparent conductive film stack can be heated during or after deposition, for example by thermal heating or by RTP flashlights. Typically, the transparent conductive oxide can be heated to temperatures of 80° C. or above. The manufacturing of the transparent conductive oxide films can be provided by chemical vapor deposition or physical vapor deposition, e.g. sputtering or evaporation. In order to provide a high yield of manufacturing, for example DC sputtering of a transparent conductive oxide layer from a rotatable target can be provided. Typical examples of the transparent conductive oxide or the transparent conductive oxide layer stack can be ITO, doped ITO, impurity-doped ZnO, $In_2O_3$, $SnO_2$ and CdO, ITO (In2O3:Sn), AZO (ZnO:Al), IZO (ZnO: In), GZO (ZnO:Ga), multi-component oxides including or consisting of combinations of ZnO, $In_2O_3$ and $SnO_2$, a layer stack from at least an ITO layer and a metal layer, e.g. an ITO/metal/ ITO-stack or a metal/ITO/metal-stack.

Figure 3B:
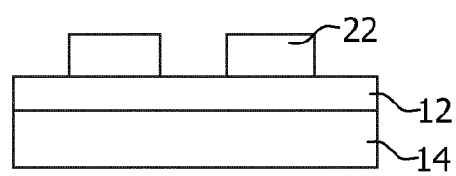

As shown in FIG. 3B, the transparent conductive oxide layer 322 (see FIG. 3A) is structured to provide a structured transparent conductive oxide layer 22. The structured TCO layer can be provided by depositing a TCO layer and patterning the TCO layer in order to provide a structured TCO layer. Further, a mask and/or a photoresist can be provided to deposit the structured TCO layer.

Figure 3C:
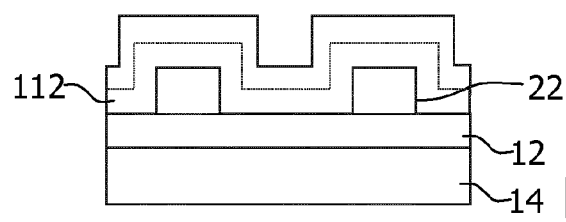

FIG. 3C illustrates deposition of a second transparent layer stack 112 over the TCO structured TCO layer 22. According to yet further embodiments, which can be combined with other embodiments described herein, the layer stack 112 is typically an index matching layer stack having at least a first dielectric film of the second transparent stack and a second dielectric film of the second transparent stack, wherein the first refractive index is provided by the first electric film and the second refractive index is provided by the second dielectric film, and wherein the second refractive index is lower from the first refractive index. According to an exemplary implementation, which can be combined with other embodiments described herein, a first dielectric film, a second dielectric film and a plurality of further dielectric films can be deposited in the second transparent layer stack such that a continuous or quasi-continuous (e.g. step-like with small steps) change in refractive index can be generated in the transparent layer stack 12. According to typical implementations, the dielectric films can be manufactured by chemical vapor deposition or physical vapor deposition, for example sputtering or evaporation. Typical examples can be insulating materials with high and low refractive indexes, for example SiOx, TiOx, NbOx, SiNx, SiOxNy, AlOx, TaOx, and combinations thereof.

Figure 3D:
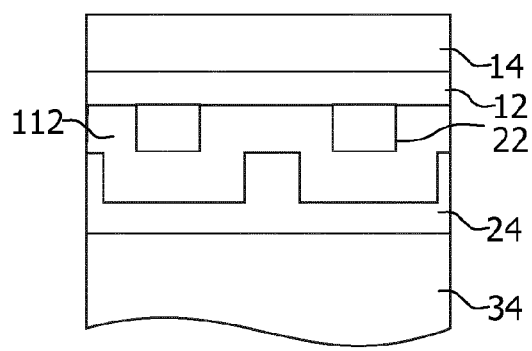

FIG. 3D illustrates a transparent adhesive 24, such as an optically clear adhesive in order to bond the transparent body to the display 34. According to different embodiments, the transparent adhesive can be an optical clear adhesive laminate or liquid optical clear adhesive with a refractive index close to a second substrate or polarizer, i.e. the substrate or polarizer of the display 34. For example, the refractive index can be close to the refractive index of glass (1.48) or of PMMA (1.6), for example, in the range between 1.48 and 1.6. According to yet further embodiments, the transparent adhesive can have a visual transmittance of 95% or above, 97% or above, or even 99% or above.

According to embodiments described herein, a structure TCO layer, e.g. an ITO layer, two index matching layers and a transparent adhesive configured for bonding to a display, a color filter, an electro-optical device, or the like, is provided such that the two index matching layer on both sides of the TCO layer provide essentially invisibility of the structures of the TCO. Accordingly, the layer stack, for example a touch panel layer stack or transparent body, can be bonded to or integrated in a display device with improved visual and electrical characteristics. As described herein, it is referred to layer stack or transparent body. It will be appreciated that these terms are used synonymously here, e.g. a transparent body is also provided by a stack of layers or films, i.e. a transparent body is also a layer stack.

Figure 4:
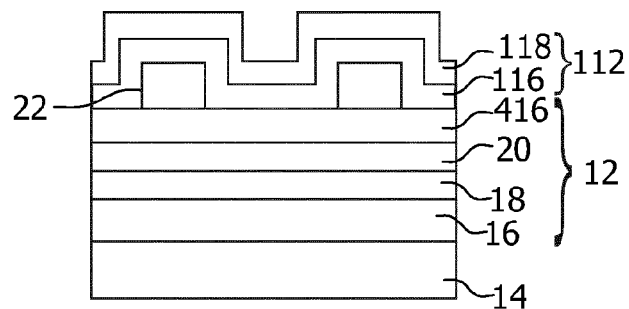
FIGS. 4 and 5 are schematic representations of yet further exemplary transparent bodies for use in a touch panel in accordance with embodiments herein.

FIG. 4 illustrates yet further embodiments, which can be combined with other embodiments described herein. As shown in FIG. 4, the substrate of the transparent body, which can for example be used in a touch panel, is provided. The substrate can be, for example, the cover lens after the transparent touch body is bonded to an electro-optical device, such as a display or the like. The embodiments described with respect to FIG. 4 include four dielectric layers 16, 18, 20 and 416, which form a transparent layer stack. On top of the transparent layer stack, the structured transparent conductive film 22 is provided. According to typical embodiments, which can be combined with other embodiments described herein, the transparent conductive oxide film can be TCO layer, which is deposited by DC sputtering from a rotatable target. However, other position techniques might be applied as well. Sputtering from a rotatable target is, for example useful for manufacturing of large area devices.

According to some embodiments, large area substrates or respective carriers, wherein the carriers have a plurality of substrates, may have a size of at least $0.174$ $m^2$. Typically, the size can be about 0.67m" (0.73×0.92m - Gen 4.5) to about 8 $m^2$ more typically about 2 $m^2$ to about 9 $m^2$ or even up to 12 $m^2$. Typically, the substrates or carriers, for which the structures, apparatuses, such as cathode assemblies, and methods according to embodiments described herein are provided, are large area substrates as described herein. For instance, a large area substrate or carrier can be GEN 4.5, which corresponds to about 0.67 $m^2$ substrates (0.73× 0.92m), GEN 5, which corresponds to about 1.4 $m^2$ substrates (1.1 m ×1.3 m), GEN 7.5, which corresponds to about 4.29 $m^2$ substrates (1.95 m ×2.2 m), GEN 8.5, which corresponds to about 5.7$m^2$ substrates (2.2 m ×2.5 m), or even GEN 10, which corresponds to about 8.7 $m^2$ substrates (2.85 m ×3.05 m). Even larger generations such as GEN 11 and GEN 12 and corresponding substrate areas can similarly be implemented.

The index matching layer stack 12, as shown in FIG. 4, together with the second transparent layer stack having dielectric layers 116 and 118 results in improved optical characteristics. The structures of the TCO layer are essentially invisible to the user of such a device due to the two transparent layer stacks. According to embodiments described herein, this can be provided for the transparent conductive films having a sheet resistance of 100 Ohm/ square or below, for example transparent conductive oxide layers of 20 nm or above, or even 100 nm or above. According to different embodiments, which can be combined with other embodiments described herein, two or more dielectric layers can be provided in the transparent layer stack 12

According to yet further embodiments, the two or more layers can be a plurality of dielectric layers or films, for example, such that a gradient in the refractive index in the layer stack is provided. For example, a first dielectric film can be provided with a first refractive index and the refractive index can be changed during further deposition of the transparent layer stack. The change can be continuous or step-like. Accordingly further dielectric films (16-20; 416) can be provided, wherein a refractive index can be obtained in the transparent layer stack. Thereby, for example SiOxNy can be deposited wherein the amount of oxygen and nitrogen is continuously or step-wise changed from y=1 to y=0 and from x=0 to x=2 or vice versa.

Figure 5:
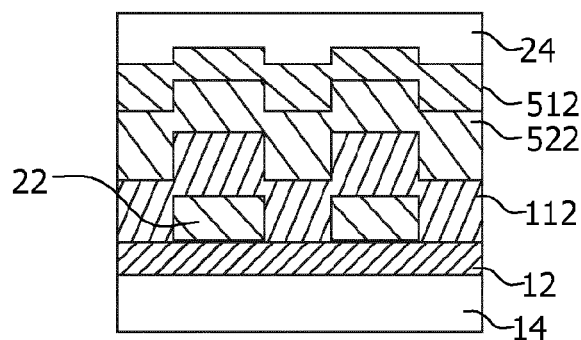

According to yet further embodiments, which can be combined with other embodiments described herein, the combination of the transparent layer stack 12 and the transparent conductive film can be repeated twice, three times or even four times. FIG. 5 shows a transparent layer stack 12 deposited over the substrate 14. The structured transparent conductive film 22 is provided on the transparent layer stack 12. Thereafter, a second transparent layer stack 112 and a further transparent conductive film 522 are deposited. Therein, different refractive indices are provided for adjacent films. The second transparent conductive film 522 is provided over the second transparent layer stack 112. The cross-section illustrated in FIG. 5 does not show a structuring of the second transparent conductive film 522. However, the structuring can be applied in the direction different as compared to the paper plane. A further transparent layer stack 512 including, for example two yet further dielectric films, is deposited over the second TCO layer 522. The transparent adhesive 24 is provided on the further transparent layer stack 512 and is configured for bonding the transparent body to the electro-optical device, such a display or the like.

According to certain embodiments, the first transparent layer stack, the transparent conductive film, and the second transparent layer stack 112 are deposited in a manner such that the a* and b* value for the manufactured transparent body is below 1.5 or, in particular 1, or more specifically, 0.7, or, even more specifically, 0.2. In particular, according to embodiments herein, the a* and b* value for the structure formed solely by the first transparent layer stack, the transparent conductive film, and the transparent adhesive, and placed above a substantially transparent substrate may adopt these values.

Figure 6:
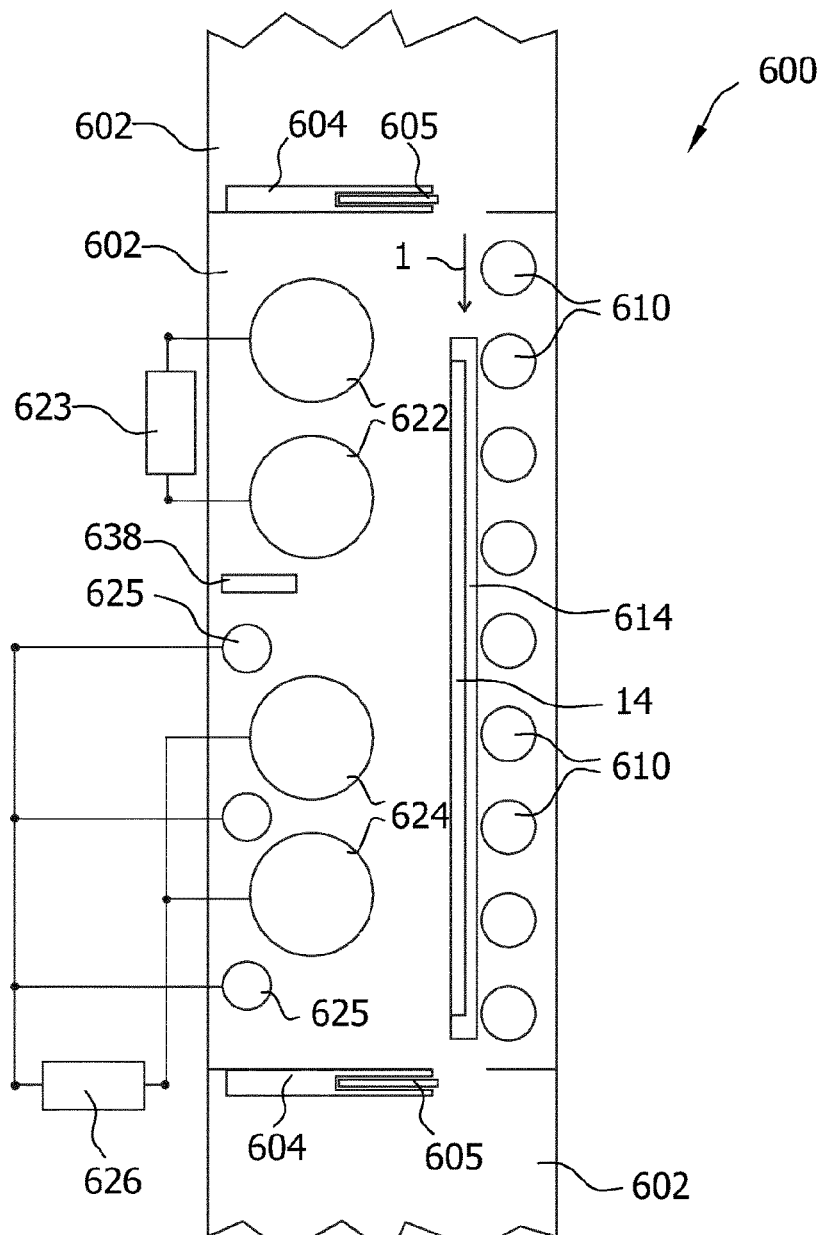
FIG. 6 is a schematic representation of a portion of an apparatus for depositing an exemplary transparent body for use in a touch panel in accordance with embodiments herein.

FIG. 6 shows a deposition apparatus 600. Exemplarily, one vacuum chamber 602 for deposition of layers therein is shown. As indicated in FIG. 6, further chambers can be provided adjacent to the chamber 602. The vacuum chamber 602 can be separated from adjacent chambers by a valve having a valve housing 604 and the valve unit 605. Thereby, after the carrier 614 with the substrate 14 thereon is, as indicated by arrow 1, inserted in the vacuum chamber 602, the valve unit 605 can be closed. Accordingly, the atmosphere in the vacuum chambers can be individually controlled by generating a technical vacuum, for example with vacuum pumps connected to the chamber 602, and/or by inserting process gases in the deposition region in the chamber.

According to typical embodiments, process gases can include inert gases such as argon and/or reactive gases such as oxygen, nitrogen, hydrogen and ammonia (NH3), Ozone (O3), or activated gases or the like. Within the chamber 602, rollers 610 are provided in order to transport the carrier 614 having the substrate 14 thereon into and out of the chamber 602.

Within the chamber 602, two different groups of deposition sources 622 and 624 are illustrated in FIG. 6. As described in more detail below, the groups of deposition sources can typically be provided in different chambers in the event different deposition processes are provided by the groups of deposition sources.

The deposition sources can for example be rotatable cathodes having targets of the material to be deposited on the substrate. Typically, the cathodes can be rotatable cathodes with a magnetron therein. Thereby, magnetron sputtering can be conducted for depositing of the layers. Cathodes 622 are connected to an AC power supply 623 such that the cathodes can be biased in an alternating manner.

As used herein, "magnetron sputtering" refers to sputtering performed using a magnet assembly, that is, a unit capable of a generating a magnetic field. Typically, such a magnet assembly consists of a permanent magnet. This permanent magnet is typically arranged within a rotatable target or coupled to a planar target in a manner such that the free electrons are trapped within the generated magnetic field generated below the rotatable target surface. Such a magnet assembly may also be arranged coupled to a planar cathode.

Thereby, magnetron sputtering can be realized by a double magnetron cathode, i.e. cathodes 622, such as, but not limited to, a TwinMag™ cathode assembly. Particularly, for MF sputtering from a silicon target, target assemblies including double cathodes can be applied. According to typical embodiments, the cathodes in a deposition chamber may be interchangeable. Accordingly, the targets are changed after the silicon has been consumed.

According to typical embodiments, that dielectric layers can be deposited by sputtering, for example magnetron sputtering, of rotatable cathodes having an AC power supply. Typically, MF sputtering can be applied for depositing the dielectric layers. Thereby, according to typical embodiments, sputtering from a silicon target, e.g. a sprayed silicon target, is conducted by MF sputtering, that is middle frequency sputtering. According to embodiments herein, middle frequency is a frequency in the range 5 kHz to 100 kHz, for example, 10 kHz to 50 kHz.

Sputtering from a target for a transparent conductive oxide film is typically conducted as DC sputtering. The cathodes 624 are connected to the DC power supply 626 together with anodes 625 collecting electrons during sputtering. Thus, according to yet further embodiments, which can be combined with other embodiments described herein, the transparent conductive oxide layers, for example the ITO layers, can be sputtered by DC sputtering, i.e. an assembly having cathodes 624.

For simplicity, the cathodes 622 and 624 are illustrated to be provided in one vacuum chamber 602. Typically, the cathodes for depositing different layers are provided in different vacuum chamber, for example the chamber 602 and the vacuum chambers adjacent to the vacuum chamber 602, as illustrated by the lower cathodes 622 in FIG. 6. This is particularly true as the dielectric layers, as described herein, which can be oxide-layers, nitrite-layers, or oxinitride-layers can be deposited by a reactive deposition process where the target material reacts with oxygen and/or nitrogen after the material has been released from the target. By providing the groups of cathodes in different chambers, an atmosphere with an appropriate processing gas and/or the appropriate degree of technical vacuum can be provided in each deposition area.

According to yet further embodiments, depending on the number of dielectric layers deposited on the substrate 14, two or more groups of cathodes 622 can be provided in the deposition apparatus 600.

According to typical embodiments, deposition is performed by sputtering of one or more rotatable targets. More specifically, according to embodiments herein, at least one of the films referred to above is deposited by sputtering of a rotatable target, so that formation of a stable transparent body and with a high quality is facilitated. For example, according to embodiments herein, a film may be deposited having a higher uniformity, and with a low density of defects and contamination particles. Thereby, it is facilitated manufacturing of a high-quality transparent body that not only yields a proper transmission of light but also yields a stable performance over time. Furthermore, a manufacturing process including sputtering of one or more rotatable targets may further facilitate a higher manufacturing rate and the production of a lower number of contaminant particles as compared to other deposition methods.

Figure 7:
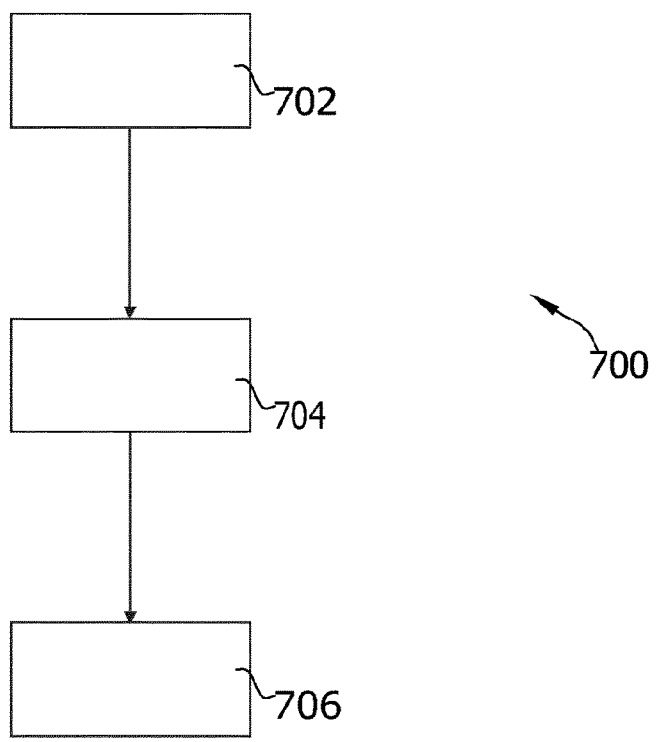
FIG. 7 is a flow chart illustrating methods of manufacturing a transparent body for use in a touch panel in accordance with embodiments herein.

FIG. 7 shows a flowchart 700 illustrating a process for manufacturing a transparent body as described herein. In step 702, the first transparent layer stack (e.g. layers stack 12) is deposited over the transparent substrate. Thereby, the layer stack includes at least two dielectric films, wherein the refractive indices of the dielectric films are different from each other and films with a higher refractive index and films with the lower refractive index can be deposited in an alternating manner. In step 704, the structured transparent conductive film, for example structured ITO layer, is deposited over the transparent layer stack 12. According to different implementations, which can be combined with other implementations described herein, the structured transparent conductive film can be also a stack of conductive films. For example, a TCO/metal/TCO-stack can be provided in step 704.

According to typical embodiments, which can be combined with other embodiments described herein, structuring procedures can be selected from the group consisting of: (1) laser scribing, (2) photo lithography, (3) printing adsorption barrier pattern (e.g. oil) followed by TCO deposition, (4) a lift-off process (formation of photo-resist pattern on substrate followed by TCO deposition and lift-off with photo-resist solvent), (5) film deposition using a shadow mask, or combinations thereof.

According to certain embodiments, one or some of the chambers may be configured for performing sputtering without a magnetron assembly. One or some chambers, for example additional chamber, may be configured for performing deposition by other methods, such as, but not limited to, chemical vapor deposition or pulsed laser deposition.

Invisible ITO solutions have extremely high demands on the optical uniformity of optical properties (color values in transmission and reflection). This corresponds technically to the deposition of uniform films with respect to film thickness and optical dispersion properties. Accordingly, the deposition apparatuses as described herein can further include a measurement system 638 configured for measuring during deposition optical properties of at least one of the films forming part of at least one of the first layer stack or the transparent conductive film.

Further, as described above, the dielectric films can be typically reactively sputtered. Accordingly, the first deposition assembly (622) can be configured for depositing the dielectric films by reactive sputtering. According to typical embodiments, Si-containing layers or Al containing layers can be sputtered reactively, and/or Nb-containing layers, Ti-containing layers or ITO-containing layers can be sputtered from a ceramic target.

According to certain embodiments, exemplary process 700 may further include a heating treatment of the substrate for degassing of the substrate prior to deposition. For example, the substrate may be heated at a temperature between 60 and 360° C. depending on the substrate speed. According to certain embodiments, exemplary process 700 may include performing a DC and/or medium frequency (MF) pre-treatment of the substrate with a power between 1 and 3 kW. Moreover, exemplary process 700 may include performing a pre-treatment of the substrate at an argon and/or oxygen atmosphere such as, for example, an oxygen rich pre-treatment. According to embodiments herein, medium frequency is a frequency in the range of 5 kHz to 100 kHz, for example, 30 kHz to 50 kHz.

The sputter coating sources in the exemplary deposition apparatuses or in an apparatus according to embodiments herein may be a DC-cathode with planar or rotatable targets (such as, but not limited to, ceramic ITO), and planar or rotatable targets (such as a doped silicon target, in particular sprayed Si targets for depositing $SiO_2$, or $Si_3N_4$, $SiO_xN_y$) or targets including a material to deposit one of the other dielectric layers disclosed herein.

As described herein, the transparent conductive film has a sheet resistance of 100 Ohm/square or below. This can be provided by providing a comparably thick transparent conductive layer and/or utilizing a TCO material with a low specific resistivity. This results in a more complex index-matching situation for reaching the required high optical performance such as pattern invisibility, color neutrality and high transmittance levels. Accordingly, in step 706 a second transparent layer stack (e.g., layers stack 12) is deposited over the transparent substrate. Thereby, the layer stack includes at least two dielectric films, wherein the refractive indices of the dielectric films are different from each other and films with a higher refractive index and films with the lower refractive index can be deposited in an alternating manner. In a further optional step a transparent adhesive, for example an optically clear adhesive, is provided in order to bond the transparent body to an electro-optical device, such as a display, a display of a mobile phone, a display of the touch panel TV, a display of the touch panel computer, or the like.

As described above, according to some embodiments, which can be combined with other embodiments described herein, the transparent body, i.e. the thin film stacks, are produced involving magnetron sputtering from rotary targets. Since invisible ITO solutions have extremely high demands on the optical uniformity of optical properties (color values in transmission and reflection), which corresponds technically to the deposition of very uniform films with respect to film thickness and optical dispersion properties. Accordingly, longer targets than the targeted sputtering height can be utilized. Thereby, sputtering from rotary targets offers advantages regarding yield, material utilization, machine up time and finally production costs, while planar targets have-deposition zones, which are responsible for enhanced particle generation, and hence need to be much longer than rotary targets to provide for particle-free and uniform films.

The written description uses examples to disclose the invention, including the best mode, and to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the examples of embodiments and embodiments or modifications thereof described above may be combined with each other.

While the foregoing is directed to embodiments of the invention, other and further embodiments of the invention may be devised without departing from the basic scope thereof, and the scope thereof is determined by the claims that follow.

The invention claimed is:

1. A process for manufacturing a transparent body for use in a touch screen panel, the process comprising:
  depositing a first transparent layer stack over a transparent substrate, wherein said first transparent layer stack includes at least a first dielectric film with a first refractive index, and a second dielectric film with a second refractive index different from the first refractive index;
  providing a structured transparent conductive film in a manner such that the first transparent layer stack and the structured transparent conductive film are disposed over the transparent substrate in this order, the structured transparent conductive film having a thickness of 60 nm or above, and wherein the structured transparent conductive film corresponds to a sheet resistance of 100 Ohm/square or below;

depositing a second transparent layer stack over the structured transparent conductive film, wherein said second transparent layer stack is selected from the group consisting of:
a layer stack, wherein the layer stack includes a third dielectric film with a gradient refractive index from a third refractive index to a fourth refractive index different from the third refractive index; and
a layer stack, wherein the layer stack includes at least a third dielectric film with a third refractive index, and a fourth dielectric film with a fourth refractive index different from the third refractive index; and
providing a transparent adhesive over the second transparent layer stack,
wherein the structured transparent conductive film is provided directly between a dielectric film of the first transparent layer stack and a dielectric film of the second transparent layer stack.

2. The process according to claim 1, wherein at least one of the first dielectric film, the second dielectric film, or the transparent conductive film is deposited by sputtering of a target.

3. The process according to claim 1, wherein providing the structured transparent conductive film comprises patterning an unstructured deposited transparent conductive film.

4. The process according to claim 1, wherein the first dielectric film has a refractive index of at least 1.8 and the second dielectric film has a refractive index of 1.5 or below; or wherein the third dielectric film has a refractive index of at least 1.8 and the transparent adhesive has a refractive index of 1.5 or below.

5. The process according to claim 1, wherein the dielectric films are sputtered by medium frequency sputtering, and the transparent conductive films are sputtered by direct current sputtering.

6. A transparent body adapted for use in a touch screen panel, comprising:
a transparent substrate;
a first transparent layer stack deposited over the transparent substrate, wherein said first transparent layer stack includes at least a first dielectric film with a first refractive index, and a second dielectric film with a second refractive index different from the first refractive index;
a transparent conductive film deposited over the first transparent layer stack, the transparent conductive film having a thickness of 60 nm or above, wherein the transparent conductive film corresponds to a sheet resistance of 100 Ohm/square or below;
a second transparent layer stack over the transparent conductive film, wherein said second transparent layer stack is selected from the group consisting of:
a first layer stack, wherein the first layer stack includes a third dielectric film with a gradient refractive index from a third refractive index to a fourth refractive index different from the third refractive index; and
a second layer stack, wherein the second layer stack includes at least a third dielectric film with a third refractive index, and a fourth dielectric film with a fourth refractive index different from the third refractive index; and
a transparent adhesive provided over the second transparent layer stack, wherein the transparent conductive film is provided directly between a dielectric film of the first transparent layer stack and a dielectric film of the second transparent layer stack.

7. The transparent body according to claim 6, wherein the first dielectric film has a refractive index of at least 1.8 and the second dielectric film has a refractive index of 1.5 or below; or wherein the third dielectric film has a refractive index of at least 1.8 and the transparent adhesive has a refractive index of 1.5 or below.

8. The transparent body according to claim 6, wherein the transparent substrate is selected from the group consisting of: a rigid substrate, a flexible substrate, an organic substrate, an inorganic substrate, a glass, a plastic foil, a polarizer material substrate, and a lambda quarter retarder substrate.

9. The transparent body according to claim 6, wherein the first transparent layer stack and the second transparent layer stack are index matching layer stacks and/or are selected from the group consisting of: $SiO_x$, $SiNx$, $SiO_xN_y$, $AlO_x$, $AlO_xN_y$, $TiO_x$, $TaOx$, $MgFx$ and $NbO_x$.

10. The transparent body according to claim 6, wherein the transparent conductive film includes indium tin oxide (ITO).

11. The transparent body according to claim 6, wherein the transparent conductive film is provided onto the second dielectric film with a refractive index of 1.5 or below, and the third dielectric film with a refractive index of 1.8 or above is provided onto the transparent conductive film.

12. The transparent body according to claim 6, wherein the transparent adhesive is provided for bonding the layer stack to the touch screen panel.

13. A deposition apparatus for manufacturing a transparent body for use in a touch screen panel, said apparatus comprising:
a first deposition assembly configured to deposit a first transparent layer stack over a substrate, said first transparent layer stack including at least first dielectric film with a first refractive index, and a second dielectric film with a second refractive index different from the first refractive index;
a second deposition assembly configured to deposit a transparent conductive film having a thickness of 60 nm or above; and
a third deposition assembly configured to deposit a second transparent layer stack over the transparent conductive film, wherein said second transparent layer stack is selected from the group consisting of:
a layer stack, wherein the layer stack includes a third dielectric film with a gradient refractive index from a third refractive index to a fourth refractive index different from the third refractive index; and
a layer stack, wherein the layer stack includes at least a third dielectric film with a third refractive index and a fourth dielectric film with a fourth refractive index different from the third refractive index, wherein the deposition apparatus is configured for providing a transparent adhesive over the second transparent layer stack;
wherein said first deposition assembly, said second deposition assembly, and the third deposition assembly are arranged such that the first transparent layer stack, the transparent conductive film and the second transparent layer stack are disposed over the substrate in this order and such that the transparent conductive film is provided directly between a dielectric film of the first transparent layer stack and a dielectric film of the second transparent layer stack, and wherein at least one of the first deposition assembly or the second deposition assembly or the third deposition assembly comprises a sputtering system operatively coupled to a target, said sputtering system being configured to deposit at least one of the first dielectric film, the second dielectric film, the third dielectric film, the fourth dielectric film or the transparent conductive film by sputtering of the target.

14. The apparatus according to claim 13, wherein the first deposition assembly, the second deposition assembly, or the third deposition assembly are configured for depositing the first transparent stack, the second transparent stack and the transparent conductive film by magnetron sputtering.

15. The process according to claim 1, wherein at least one of the first dielectric film the second dielectric film, or the transparent conductive film is deposited by sputtering of a rotary target.

16. The process according to claim 1, wherein the first dielectric film has a refractive index of at least 1.8 and the second dielectric film has a refractive index of 1.5 or below; and wherein the third dielectric film has a refractive index of at least 1.8 and the transparent adhesive has a refractive index of 1.5 or below.

17. The process according to claim 1, wherein the dielectric films are sputtered by medium frequency sputtering from a rotatable target, and the transparent conductive films are sputtered by direct current sputtering from a rotatable target.

18. The transparent body according to claim 9, wherein the first dielectric film has a refractive index of at least 1.8 and the second dielectric film has a refractive index of 1.5 or below; and wherein the third dielectric film has a refractive index of at least 1.8 and the transparent adhesive has a refractive index of 1.5 or below.

19. The transparent body according to claim 9, wherein the transparent conductive film has a thickness of 60 nm to 150 nm.

* * * * *

UNITED STATES PATENT AND TRADEMARK OFFICE
CERTIFICATE OF CORRECTION

PATENT NO. : 10,281,616 B2
APPLICATION NO. : 14/384820
DATED : May 7, 2019
INVENTOR(S) : Jurgen Grillmayer et al.

It is certified that error appears in the above-identified patent and that said Letters Patent is hereby corrected as shown below:

In the Specification

In Column 6, Line 38, delete "IB," and insert -- 1B, --, therefor.

In Column 7, Line 58, delete "$Nb_2O_5of$" and insert -- $Nb_2O_5$ of --, therefor.

In Column 7, Line 59, delete "Si02" and insert -- SiO2 --, therefor.

In Column 7, Line 65, delete "Si02" and insert -- SiO2 --, therefor.

In Column 8, Line 28, delete "Si02" and insert -- SiO2 --, therefor.

In Column 8, Line 34, delete "Si02" and insert -- SiO2 --, therefor.

In Column 8, Line 53, delete "Si02" and insert -- SiO2 --, therefor.

In Column 8, Line 59, delete "Si02" and insert -- SiO2 --, therefor.

In Column 9, Line 4, delete "$Nb_2O_5of$" and insert -- $Nb_2O_5$ of --, therefor.

In Column 9, Line 5, delete "Si02" and insert -- SiO2 --, therefor.

In Column 9, Line 10, delete "Si02" and insert -- SiO2 --, therefor.

In Column 9, Line 32, delete "[[$Si_3N_4$" and insert -- $Si_3N_4$ --, therefor.

In Column 12, Line 18, delete "$m^2more$" and insert -- $m^2$, more --, therefor.

In Column 12, Line 46, after "12" insert -- . --.

Signed and Sealed this
Twenty-seventh Day of August, 2019

Andrei Iancu
*Director of the United States Patent and Trademark Office*